US012604421B2

(12) United States Patent
Doi et al.

(10) Patent No.: US 12,604,421 B2
(45) Date of Patent: Apr. 14, 2026

(54) ELECTRONIC COMPONENT MODULE

(71) Applicants: YAZAKI CORPORATION, Tokyo (JP); TOYOTA JIDOSHA KABUSHIKI KAISHA, Toyota (JP)

(72) Inventors: Teppei Doi, Makinohara (JP); Joh Fujimoto, Makinohara (JP); Yoku Murayama, Makinohara (JP); Gota Murai, Toyota (JP); Akihito Tsukamoto, Toyota (JP); Toshiki Nunotani, Toyota (JP)

(73) Assignees: YAZAKI CORPORATION, Tokyo (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 158 days.

(21) Appl. No.: 18/193,014

(22) Filed: Mar. 30, 2023

(65) Prior Publication Data

US 2023/0354528 A1 Nov. 2, 2023

(30) Foreign Application Priority Data

Apr. 28, 2022 (JP) ................................. 2022-075179

(51) Int. Cl.
*H05K 1/14* (2006.01)
*H05K 3/36* (2006.01)
*H02G 3/16* (2006.01)

(52) U.S. Cl.
CPC ................. *H05K 3/36* (2013.01); *H05K 1/14* (2013.01); *H02G 3/16* (2013.01)

(58) Field of Classification Search
CPC ..................... H05K 1/14; H05K 1/144; H05K 2201/10189; H05K 2201/10303; H05K 2201/1059; H01R 12/523; H01R 12/585
See application file for complete search history.

(56) References Cited

U.S. PATENT DOCUMENTS 4,973,260 A * 11/1990 Madore ................ H01R 12/727
                                                    439/65
6,280,248 B1 * 8/2001 Mitra ................. H01R 12/7064
                                                    439/571

(Continued)

FOREIGN PATENT DOCUMENTS

JP        2007-103088 A        4/2007
JP        2014-49329 A        3/2014
JP        2018-67614 A        4/2018

*Primary Examiner* — Paresh Paghadal
(74) *Attorney, Agent, or Firm* — Sughrue Mion, PLLC

(57) ABSTRACT

An electronic component module includes a first board, a second board, and an inter-board connecting portion disposed between the first and second boards and including terminal portions and a holding portion having a plurality of insertion holes into which the terminal portions are inserted. The terminal portion includes a protruding portion provided between one end and another end of the terminal portion in an insertion direction of the terminal portion into the insertion hole and protruding from the terminal portion in a direction intersecting the insertion direction. The one end and the other end of the terminal portions are electrically connected to the first and second boards, respectively. The inter-board connecting portion includes a partition wall partitioning first insertion hole and second insertion hole adjacent to each other and extending to a position in the insertion direction beyond the protruding portions of the terminal portions.

8 Claims, 7 Drawing Sheets

(56)             References Cited

U.S. PATENT DOCUMENTS

| | | | | |
|---|---|---|---|---|
| 6,719,573 | B2 * | 4/2004 | Koehler | H01R 43/20 439/744 |
| 2005/0142905 | A1 * | 6/2005 | Maejima | H01R 12/523 439/76.2 |
| 2005/0208797 | A1 * | 9/2005 | Duncan | H01R 4/028 439/83 |
| 2005/0277312 | A1 * | 12/2005 | Nakamura | H01R 12/585 439/82 |
| 2006/0134945 | A1 * | 6/2006 | Kuo | H01R 12/728 439/74 |
| 2007/0077813 | A1 * | 4/2007 | Matsumura | H01R 12/585 439/578 |
| 2007/0087592 | A1 | 4/2007 | Thomson et al. | |
| 2008/0050946 | A1 * | 2/2008 | Nunokawa | H01R 12/585 439/82 |
| 2012/0156898 | A1 * | 6/2012 | Kallee | H01R 12/523 439/65 |
| 2014/0065897 | A1 | 3/2014 | Kida et al. | |
| 2015/0011114 | A1 * | 1/2015 | Endo | H01R 13/58 439/449 |
| 2017/0054233 | A1 * | 2/2017 | Kikuchi | H01R 12/585 |
| 2022/0328988 | A1 * | 10/2022 | Wang | B60L 53/16 |

* cited by examiner

UPPER

LEFT    REAR

FRONT    RIGHT

LOWER

UPPER

LEFT    REAR

FRONT    RIGHT

LOWER

ELECTRONIC COMPONENT MODULE

CROSS-REFERENCE TO RELATED APPLICATIONS

This application is based on and claims priority under 35 USC 119 from Japanese Patent Application No. 2022-075179 filed on Apr. 28, 2022, the contents of which are incorporated herein by reference.

TECHNICAL FIELD

The present invention relates to an electronic component module.

BACKGROUND ART

In the related art, an electronic component module including a plurality of circuit boards on which a plurality of electronic components are mounted has been proposed. For example, one of electronic component modules in the related art is configured to achieve electrical connection between a pair of circuit boards by arranging the pair of circuit boards to face each other and fitting a male connector provided on one circuit board and a female connector provided on the other circuit board (for example, see Patent Literature 1).

CITATION LIST

Patent Literature

Patent Literature 1: JP2018-067614A

SUMMARY OF INVENTION

In the electronic component module in the related art described above, a space corresponding to at least outer shapes of the male connector and the female connector is required between the one circuit board and the other circuit board due to the structure in which the electrical connection is achieved by connector fitting. As a result, a size of the electronic component module is increased by the space. Further, when a plurality of male connectors are provided on the one circuit board and a plurality of female connectors are provided on the other circuit board to achieve connector fitting at a plurality of positions, manufacturing cost of the electronic component module increases due to an increase in the number of components of the male connectors and the female connectors and complication of component management.

An object of the present invention is to provide an electronic component module that can be reduced in size and manufacturing cost.

In order to achieve the above object, an electronic component module according to the present invention is characterized as follows.

The electronic component module includes a first board;

a second board disposed to face the first board; and an inter-board connecting portion disposed between the first board and the second board, the inter-board connecting portion including a plurality of rod-shaped terminal portions and a holding portion having a plurality of insertion holes into which the plurality of terminal portions are inserted and held at intervals. For each of the plurality of terminal portions, a protruding portion is provided between one end and another end of the terminal portion in an insertion direction of the terminal portion into the insertion hole and protrudes from the terminal portion in a direction intersecting the insertion direction. The one end of the terminal portion is electrically connected to the first board, and the other end of the terminal portion is electrically connected to the second board. The inter-board connecting portion includes a partition wall that partitions first insertion hole and second insertion hole adjacent to each other. The partition wall extends to a position in the insertion direction beyond the protruding portions of the terminal portions held in the first insertion hole and the second insertion hole.

According to an electronic component module of the present invention, the inter-board connecting portion (for example, the pin header) in which the plurality of rod-shaped terminal portions (for example, the pin terminals) are held by the holding portion is disposed between the first board and the second board. Further, one end of the terminal portion is electrically connected to the first board, and the other end of the terminal portion is electrically connected to the second board, so that the first board and the second board are electrically connected. As a result, as compared with a case where connector fitting is used as in an electronic component module in the related art, manufacturing cost can be reduced by reducing the number of components, and since the connection structure is simpler than the connector fitting, a space between boards is reduced, and the size of the electronic component module can be reduced.

Further, the insertion holes provided in the inter-board connecting portion are partitioned by the partition wall, and the partition wall extends to a position beyond the protruding portions of the terminal portions held in the insertion holes in the insertion direction. Thus, the creeping distance between the protruding portions of the adjacent terminal portions is longer than a creeping distance when the protruding portions are coupled in a straight line by an amount corresponding to the blocking by the partition wall on the straight line coupling the protruding portions. As a result, even when the plurality of terminal portions are arranged at a high density in the holding portion, the terminal portions can be appropriately insulated. This also contributes to reduction in size and manufacturing cost of the electronic component module.

Therefore, according to the present invention, the size and manufacturing cost of the electronic component module can be reduced.

BRIEF DESCRIPTION OF DRAWINGS

Exemplary embodiment(s) of the present invention will be described in detail based on the following figures, wherein.

DESCRIPTION OF EMBODIMENTS

Embodiment

Hereinafter, an electronic component module 1 according to an embodiment of the present invention shown in FIG. 1 will be described with reference to the drawings. The electronic component module 1 is typically incorporated in an electrical junction box mounted on a vehicle for the purpose of communication, control, power distribution, power supply, and the like.

Figure 1:
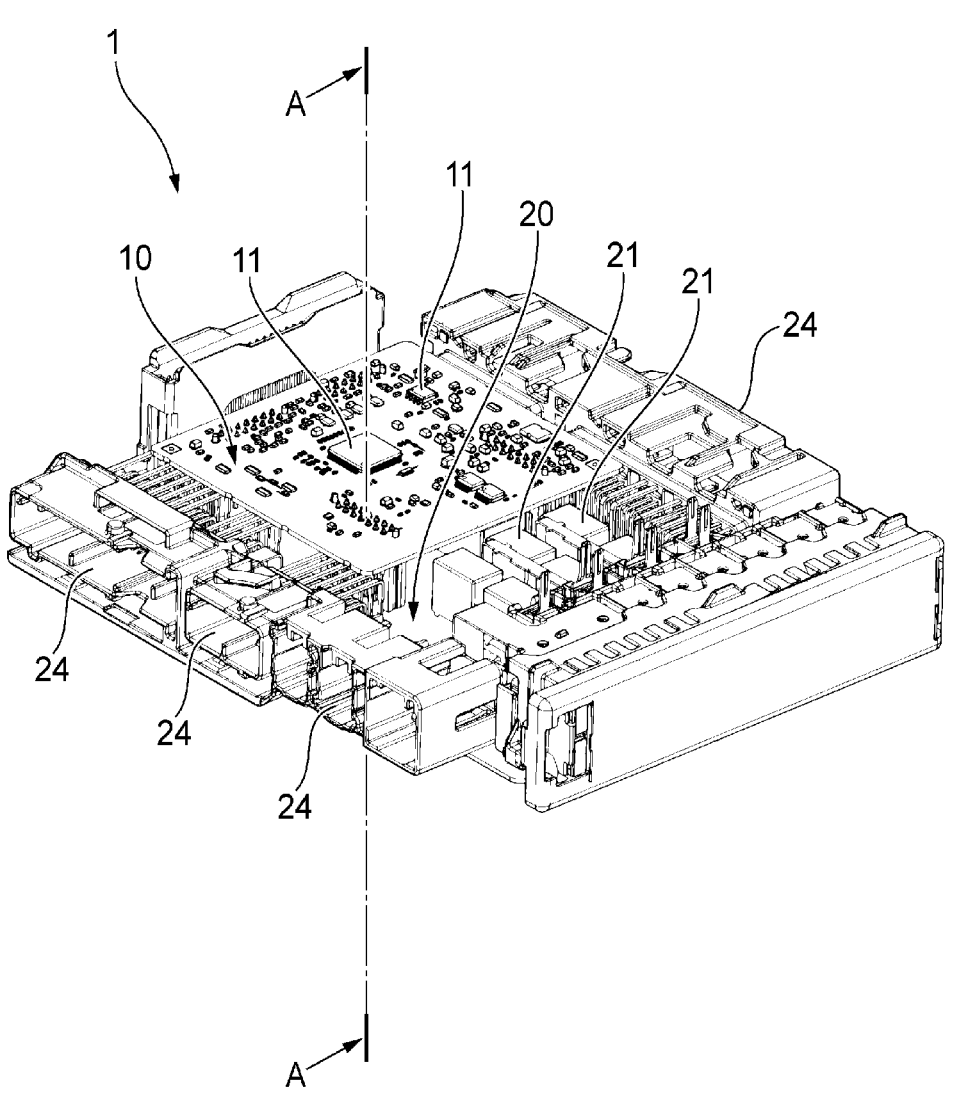
FIG. 1 is a perspective view of an electronic component module according to an embodiment.
Figure 1:
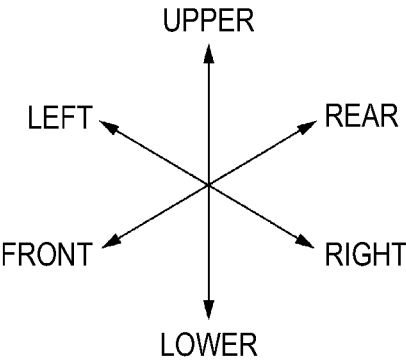

Hereinafter, for convenience of description, as shown in FIG. 1, "front", "rear", "left", "right", "upper", and "lower" are defined. A "front-rear direction", a "left-right direction", and an "upper-lower direction" are orthogonal to one another. The directions are defined for convenience of description, and do not necessarily correspond to a front-rear direction, a left-right direction, and an upper-lower direction of the vehicle when the electronic component module 1 is mounted on the vehicle.

Figure 2:
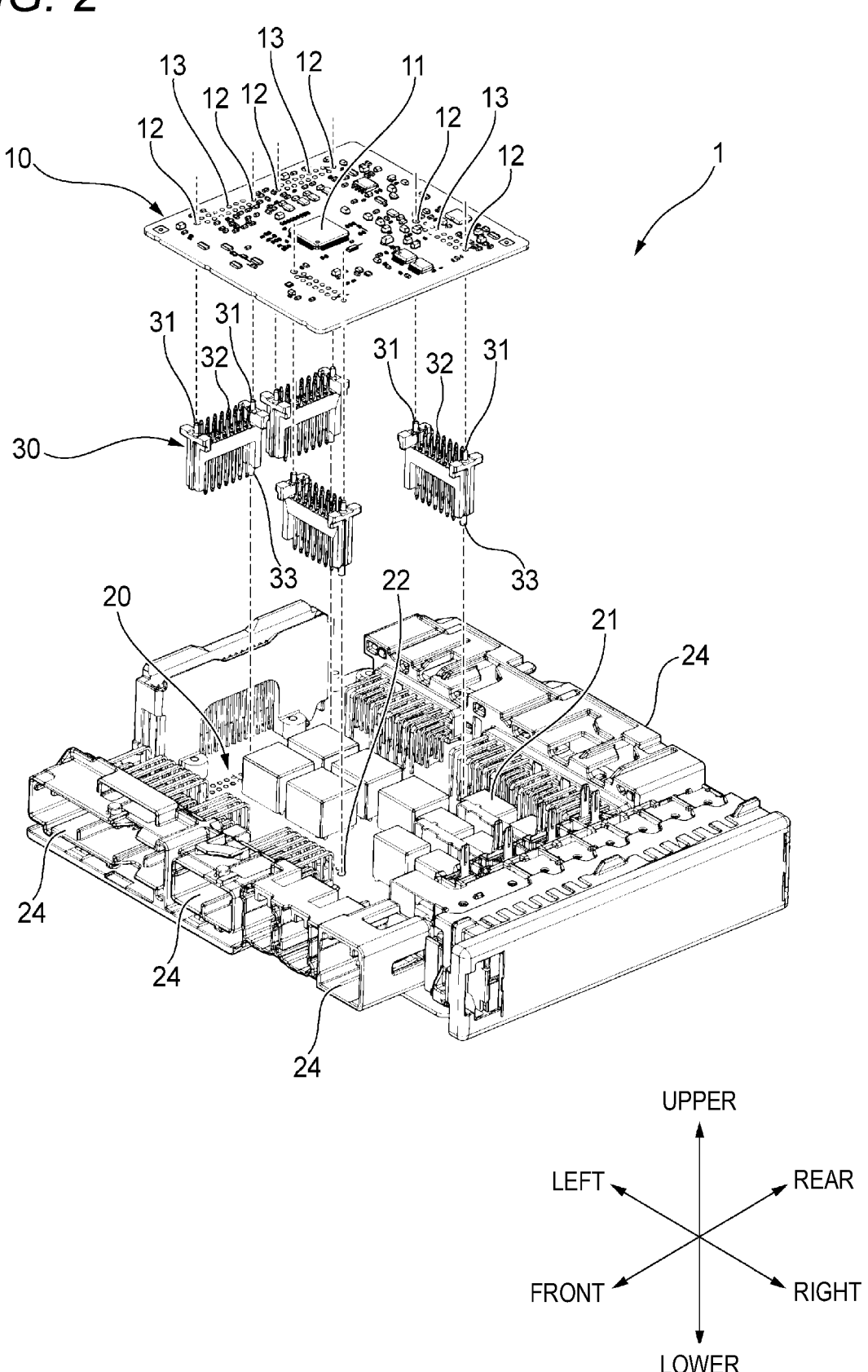
FIG. 2 is an exploded perspective view of the electronic component module according to the embodiment.
Figure 3:
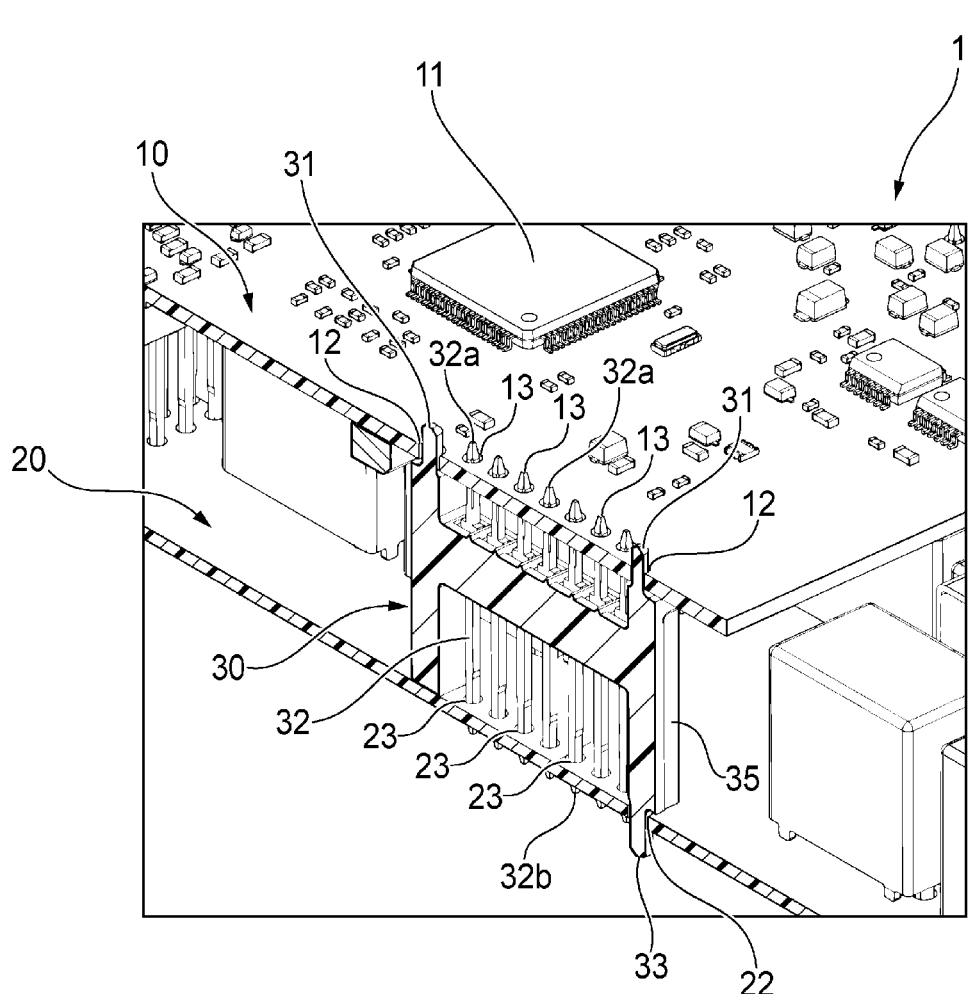
FIG. 3 is a cross-sectional view taken along a line A-A in FIG. 1.
Figure 3:
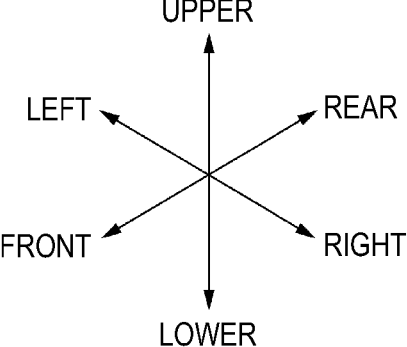

The electronic component module 1 includes a first board 10, a second board 20, and a pin header 30 electrically connecting the first board 10 and the second board 20 (see FIGS. 1 to 3).

The first board 10 is an auxiliary board of the electronic component module 1, and is disposed to face the second board 20 in the upper-lower direction. The first board 10 is formed in a flat plate shape, and is formed of a hard material such as Bakelite, paper phenol, and glass epoxy resin. Printed wirings (not shown) that connect a plurality of electronic components 11 mounted on the first board 10 and printed wirings (not shown) that are used when the first board 10 and the second board 20 are electrically connected are formed on at least one surface of a front surface or a back surface of the first board 10 (see FIGS. 1 and 2).

The first board 10 is provided with a plurality of fixing holes 12 penetrating from the front surface to the back surface. Upper fixing protrusions 31 of the pin header 30 are inserted into the fixing holes 12. The plurality of fixing holes 12 are formed with the same number as that of the upper fixing protrusions 31. Further, the first board 10 is provided with a plurality of terminal holes 13 penetrating from the front surface to the back surface. The terminal holes 13 are used so that upper end portions 32a of pin terminals 32 provided in the pin header 30 are inserted therein and the upper end portions 32a of the pin terminals 32 and the printed wirings are soldered (see FIG. 3).

The second board 20 is a main board of the electronic component module 1. The second board 20 is formed in a flat plate shape, and is formed of a hard material such as Bakelite, paper phenol, and glass epoxy resin. Printed wirings (not shown) that connect a plurality of electronic components 21 mounted on the second board 20 and printed wirings (not shown) that are used when the first board 10 and the second board 20 are electrically connected are formed on at least one surface of a front surface or a back surface of the second board 20.

The second board 20 is provided with a plurality of fixing holes 22 penetrating from the front surface to the back surface. Lower fixing protrusions 33 of the pin header 30 are inserted into the fixing holes 22. The plurality of fixing holes 22 are formed with the same number as that of the lower fixing protrusions 33. Further, the second board 20 is provided with a plurality of terminal holes 23 penetrating from the front surface to the back surface. The terminal holes 23 are used so that lower end portions 32b of the pin terminals 32 provided in the pin header 30 are inserted therein and the lower end portions 32b of the pin terminals 32 and the printed wirings are soldered.

A plurality of connectors 24 are mounted on the second board 20. A mating connector (not shown) provided at an end or the like of an electric wire extending from various external devices or a power source (not shown) is fitted to the plurality of connectors 24. By such connector fitting, the electronic components 11 mounted on the first board 10 and the electronic components 21 mounted on the second board 20 are electrically connected to an external device and the power source.

Figure 4:
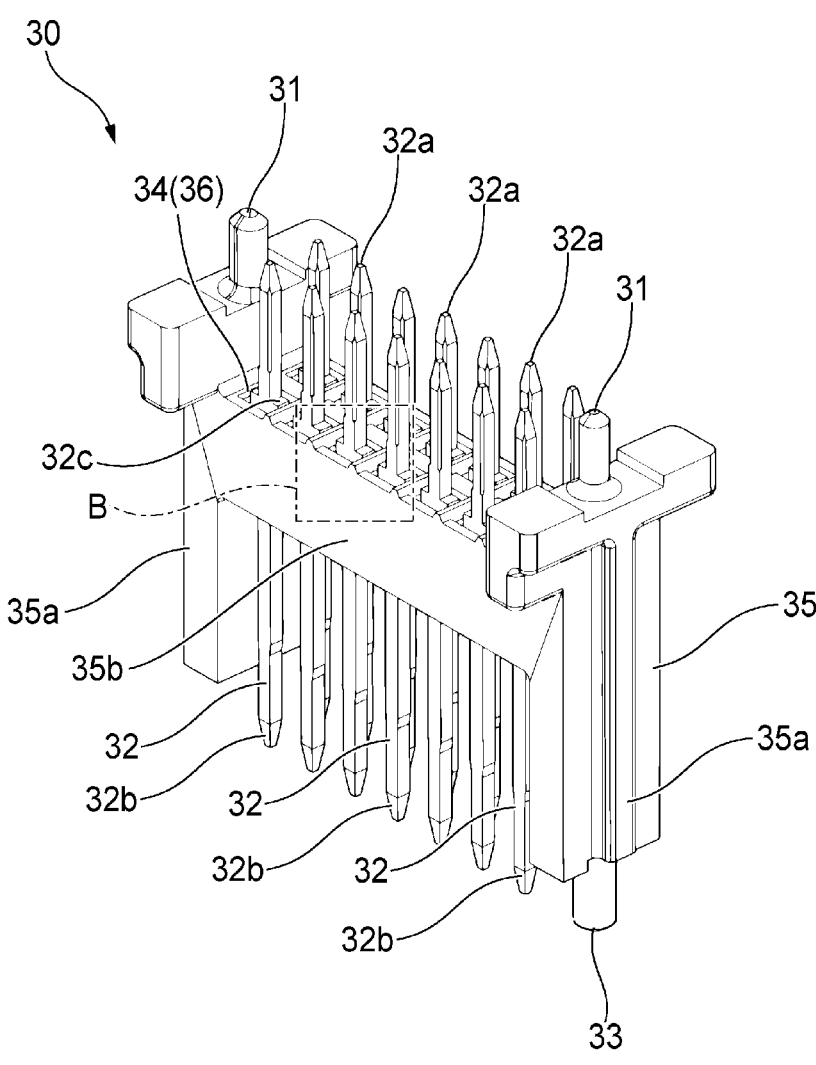
FIG. 4 is a perspective view of a pin header used in the electronic component module.
Figure 4:
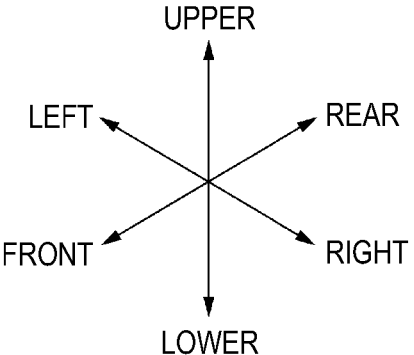

The pin header 30 includes the plurality of pin terminals 32 and a housing 35 made of resin and having a plurality of insertion holes 34 into which the plurality of pin terminals 32 are inserted (press-fitted) and fixed. The housing 35 has board fixing portions 35a extending in the upper-lower direction at a left end portion and a right end portion of the housing 35, and a terminal holding portion 35b extending in the left-right direction so as to connect the board fixing portion 35a on a left end side and the board fixing portion 35a on a right end side. The upper fixing protrusion 31 is erected upward on an upper surface of the board fixing portion 35a on the left end side. The upper fixing protrusion 31 is erected upward on an upper surface of the board fixing portion 35a on the right end side, and the lower fixing protrusion 33 is erected downward on a lower surface of the board fixing portion 35a on the right end side (see FIG. 4).

Figure 7:
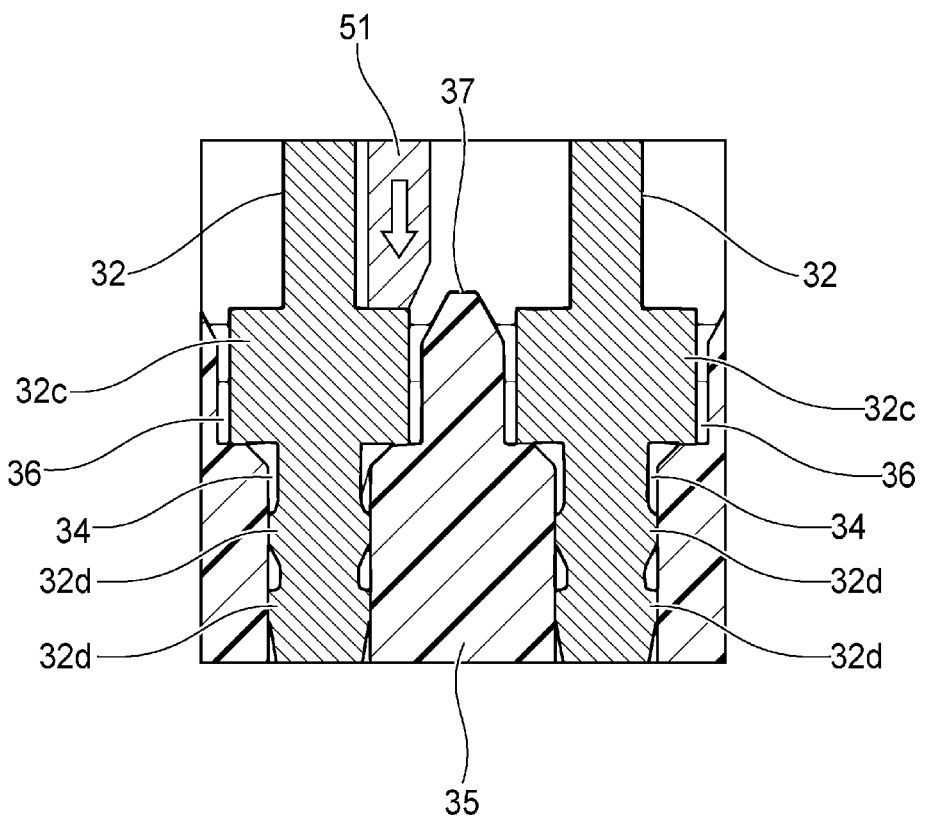
FIG. 7 is a cross-sectional view corresponding to FIG. 6, showing how a pin terminal is press-fitted into a housing.
Figure 7:
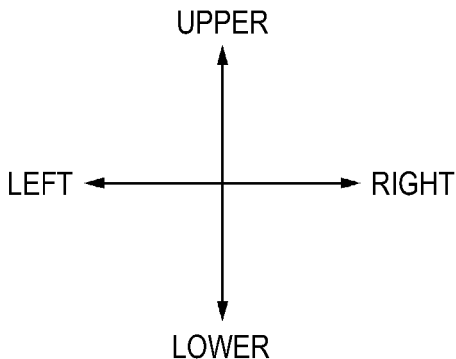

In the terminal holding portion 35b of the pin header 30, a plurality of (seven in the embodiment) insertion holes 34 aligned in the left-right direction are arranged in two rows in the front-rear direction. The pin terminals 32 are press-fitted into the insertion holes 34, respectively. Each of the pin terminals 32 has a rod shape extending in the upper-lower direction, and has a protruding portion 32c protruding in a direction intersecting an insertion direction into the insertion hole 34 at a substantially central portion between the upper end portion 32a and the lower end portion 32b. As shown in FIG. 7, the protruding portion 32c is a portion for pressing a press-fitting jig 51 when the pin terminal 32 is press-fitted into the insertion hole 34. When the pin terminal 32 is completely press-fitted into the insertion hole 34, the protruding portion 32c is accommodated in an accommodation space 36 disposed above the insertion hole 34.

The pin terminal 32 has engagement protrusions 32d protruding in the left-right direction from the pin terminal 32 at a plurality of positions below the protruding portion 32c (see FIGS. 6 and 7). When the pin terminal 32 is press-fitted into the insertion hole 34, the engagement protrusions 32d are engaged with an inner wall of the insertion hole 34 so as to press the inner wall. Accordingly, the pin terminal 32 is fixed in the upper-lower direction, and positional deviation of the pin terminal 32 in the upper-lower direction is prevented.

Figure 5:
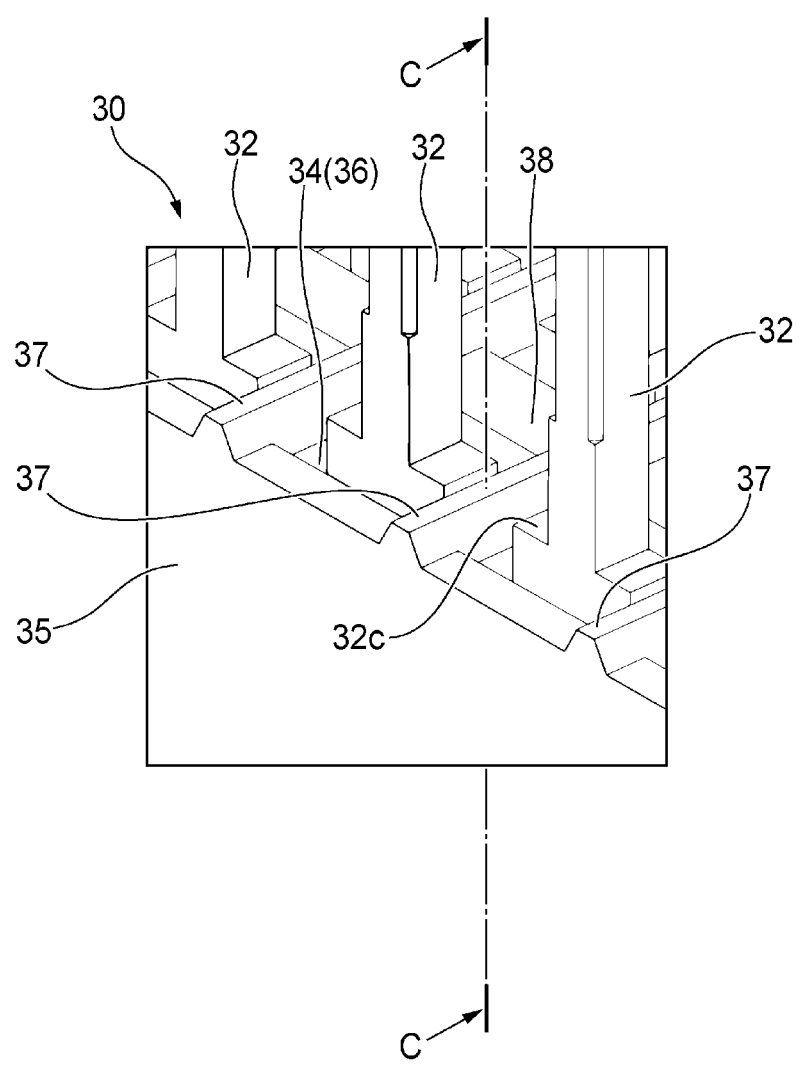
FIG. 5 is an enlarged view of a portion B in FIG. 4.
Figure 5:
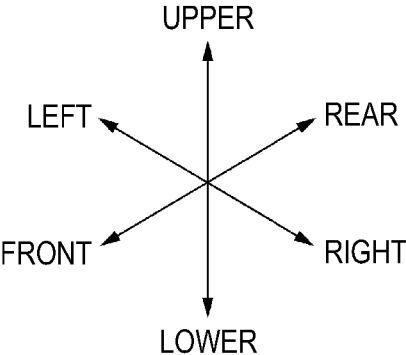
Figure 6:
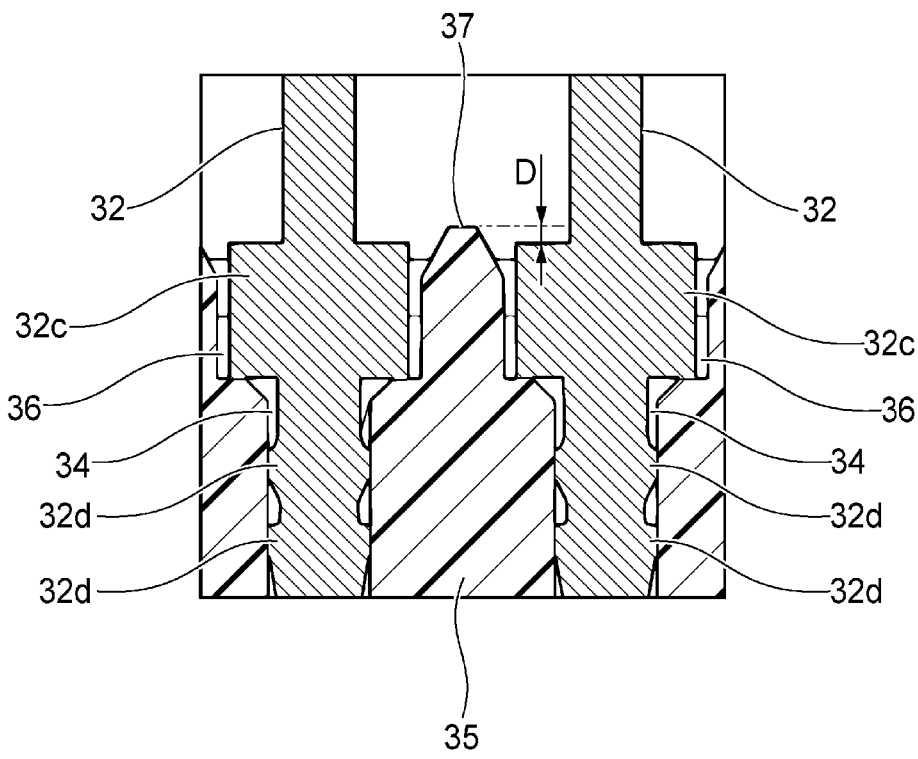
FIG. 6 is a cross-sectional view taken along a line C-C in FIG. 5.
Figure 6:
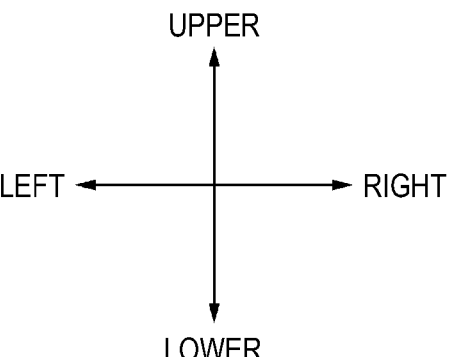

As shown in FIGS. 5 and 6, the accommodation spaces 36 in which the protruding portions 32c of the pin terminals 32 are accommodated are partitioned by partition walls 37 in the left-right direction. An upper end portion of the partition wall 37 (that is, an extending end portion in the insertion direction of the pin terminal 32) is located above an upper surface of the protruding portion 32c by a distance D (D>0). In other words, the partition wall 37 extends to a position above the protruding portion 32c of the pin terminal 32 in the insertion direction (upper-lower direction). Since the partition wall 37 extends in this way, a distance (creeping distance) between the protruding portions 32c of the adjacent pin terminals 32 is longer than a creeping distance when the protruding portions 32c are coupled in a straight line by an amount corresponding to the blocking by the partition wall 37 on the straight line coupling the protruding portions 32c. As a result, insulation between the pin terminals 32 is improved.

Further, the upper end portion (extending end portion) of the partition wall 37 has a tapered shape in which a cross-sectional area of the partition wall 37 decreases (specifically, a thickness in the left-right direction decreases) toward the upper end portion (see FIGS. 5 to 7). Since the partition wall 37 has such a tapered shape, as shown in FIG. 7, when the pin terminal 32 is press-fitted into the insertion hole 34 using the press-fitting jig 51, interference between the upper end portion of the partition wall 37 and the press-fitting jig 51 can be avoided.

In this embodiment, a central partition wall 38 (see FIG. 5) that partitions the accommodation spaces 36 from each other in the front-rear direction does not extend to a position where an upper end portion of the central partition wall 38 exceeds above the protruding portion 32c in the insertion direction (upper-lower direction), and does not have the tapered shape described above. However, similarly to the partition wall 37, the upper end portion of the central partition wall 38 may extend to a position above the protruding portion 32c in the insertion direction (upper-lower direction), or may have the tapered shape described above.

<Functions and Effects>

As described above, according to the electronic component module 1 of the present embodiment, the pin header 30 in which the plurality of rod-shaped pin terminals 32 are held by the housing 35 is disposed between the first board 10 and the second board 20. Further, the upper end portions 32a of the pin terminals 32 are electrically connected to the first board 10, and the lower end portions 32b of the pin terminals 32 are electrically connected to the second board 20, so that the first board 10 and the second board 20 are electrically connected. As a result, as compared with a case where connector fitting is used as in an electronic component module in the related art, manufacturing cost can be reduced by reducing the number of components, and since the connection structure is simpler than the connector fitting, a space between boards is reduced, and the size of the electronic component module 1 can be reduced.

Further, the insertion holes 34 provided in the pin header 30 are partitioned by the partition walls 37, and the partition walls 37 extend to a position above the protruding portions 32c of the pin terminals 32 held in the insertion holes 34 in the insertion direction. Thus, the creeping distance between the protruding portions 32c of the adjacent pin terminals 32 is longer than a creeping distance when the protruding portions 32c are coupled in a straight line by an amount corresponding to the blocking by the partition wall 37 on the straight line coupling the protruding portions 32c. As a result, even when the plurality of pin terminals 32 are arranged at high density in the housing 35, the pin terminals 32 can be appropriately insulated. This also contributes to reduction in size and manufacturing cost of the electronic component module 1.

Therefore, according to the present invention, the size and manufacturing cost of the electronic component module 1 can be reduced.

Further, the upper end portion of the partition wall 37 of the pin header 30 has the above-described tapered shape. Accordingly, when the pin terminal 32 is press-fitted into the insertion hole 34 while pressing the press-fitting jig 51 against the protruding portion 32c of the pin terminal 32, the press-fitting jig 51 hardly interferes with the partition wall 37. Therefore, even though the partition wall 37 is extended as described above so as to increase the creeping distance, the workability of an operation of press-fitting the pin terminal 32 is not impaired. Thus, the productivity in manufacturing the electronic component module 1 can be improved.

OTHER EMBODIMENTS

The present invention is not limited to the above embodiment, and various modifications can be adopted within the scope of the present invention. For example, the present invention is not limited to the above embodiment, and may be appropriately modified, improved or the like. In addition, the material, shape, size, number, arrangement position and the like of each component in the embodiment described above are optional and are not limited as long as the invention can be achieved.

Further, characteristics of the embodiment of the electronic component module 1 according to the present invention described above will be briefly summarized in the following [1] and [2].

[1] An electronic component module (1) including:
a first board (10) and a second board (20) disposed to face each other; and
an inter-board connecting portion (30) disposed between the first board (10) and the second board (20), the inter-board connecting portion (30) including a plurality of rod-shaped terminal portions (32) and a holding portion (35) having a plurality of insertion holes (34) into which the plurality of terminal portions (32) are inserted and held at intervals, in which
for each of the plurality of terminal portions (32),
a protruding portion (32c) is provided between one end (32a) and another end (32b) of the terminal portion (32) in an insertion direction of the terminal portion (32) into the insertion hole (34) and protrudes from the terminal portion (32) in a direction intersecting the insertion direction, the one end (32a) is electrically connected to the first board (10), and the other end (32b) is electrically connected to the second board (20), and
the inter-board connecting portion (30) includes a partition wall (37) that partitions one of the insertion holes (34) and another of the insertion holes (34) adjacent to each other and that extends to a position in the insertion direction beyond the protruding portions (32c) of the terminal portions (32) held in the one insertion hole (34) and the other insertion hole (34).

According to the electronic component module having the configuration of [1], the inter-board connecting portion (for example, the pin header) in which the plurality of rod-shaped terminal portions (for example, the pin terminals) are held by the holding portion is disposed between the first board and the second board. Further, one end of the terminal portion is electrically connected to the first board, and the other end of the terminal portion is electrically connected to the second board, so that the first board and the second board are electrically connected. As a result, as compared with a case where connector fitting is used as in an electronic component module in the related art, manufacturing cost can be reduced by reducing the number of components, and since the connection structure is simpler than the connector fitting, a space between boards is reduced, and the size of the electronic component module can be reduced.

Further, the insertion holes provided in the inter-board connecting portion are partitioned by the partition wall, and the partition wall extends to a position beyond the protruding portions of the terminal portions held in the insertion holes in the insertion direction. Thus, the creeping distance between the protruding portions of the adjacent terminal portions is longer than a creeping distance when the protruding portions are coupled in a straight line by an amount corresponding to the blocking by the partition wall on the straight line coupling the protruding portions. As a result, even when the plurality of terminal portions are arranged at a high density in the holding portion, the terminal portions can be appropriately insulated. This also contributes to reduction in size and manufacturing cost of the electronic component module.

[2] In the electronic component module (1) according to [1], the partition wall (37) of the inter-board connecting portion (30) has a tapered shape in which a sectional area of the partition wall (37) decreases toward an extending end portion of the partition wall (37) in the insertion direction at least around the extending end portion.

According to the electronic component module having the configuration of [2], the upper end portion of the partition wall of the inter-board connecting portion has the tapered shape described above. Accordingly, when the terminal portion is press-fitted into the insertion hole while pushing a predetermined press-fitting jig against the protruding portion of the terminal portion, the press-fitting jig hardly interferes with the partition wall. Therefore, even though the partition wall is extended as described above so as to increase the creeping distance, the workability of an operation of press-fitting the pin terminal is not impaired. Thus, the productivity in manufacturing the electronic component module can be improved.

What is claimed is:

1. An electronic component module comprising:

a first board and a second board disposed to face each other; and an inter-board connection assembly disposed between the first board and the second board, wherein the inter-board connection assembly includes:

a plurality of terminal portions, and a housing comprising:

a terminal holding portion comprising a plurality of insertion holes into which the plurality of terminal portions are inserted and held at intervals, and board fixing portions disposed at ends of the terminal holding portion, wherein, for each terminal portion of the plurality of terminal portions:

a protruding portion is provided between one end of the terminal portion and another end of the terminal portion in an insertion direction of the terminal portion into a corresponding insertion hole, the protruding portion being disposed outside of the corresponding insertion hole and the protruding portion protruding from the terminal portion in a direction intersecting the insertion direction, and the one end of the terminal portion is electrically connected to the first board and the other end of the terminal portion is electrically connected to the second board, wherein the inter-board connection assembly includes a partition wall that partitions a first insertion hole of the plurality of insertion holes and a second insertion hole of the plurality of insertion holes adjacent to each other, the partition wall extending to a position in the insertion direction beyond the protruding portions of the terminal portions held in the first insertion hole and the second insertion hole, and wherein the partition walls extend from an outer surface of the terminal holding portion, wherein the terminal holding portion further comprising a plurality of accommodation spaces located above the plurality of insertion holes, and wherein, for each terminal portion of the plurality of terminal portions, the protruding portion is disposed within a corresponding accommodation space with at least a portion of the protruding portion extending above the outer surface of the terminal holding portion.

2. The electronic component module according to claim 1, wherein the partition wall of the inter-board connection assembly has a tapered shape in which a sectional area of the partition wall decreases toward an extending end portion of the partition wall in the insertion direction at least around the extending end portion.

3. The electronic component module according to claim 1, wherein the plurality of terminal portions are rod-shaped.

4. The electronic component module according to claim 1, wherein the partition walls are part of an outer surface of the inter-board connection assembly.

5. The electronic component module according to claim 1, wherein the board fixing portions are T-shaped.

6. The electronic component module according to claim 1, wherein the housing further includes at least one protrusion extending from the board fixing portions, the at least one protrusion being configured to interact with at least one of the first board and the second board.

7. The electronic component module according to claim 1, wherein a tip of the partition wall is disposed beyond the protruding portion.

8. The electronic component module according to claim 2, wherein a tip of the extending end portion of the partition wall is located above an upper surface of the protruding portion.

* * * * *